(12) United States Patent
Ogawa et al.

(10) Patent No.: US 7,558,126 B2
(45) Date of Patent: Jul. 7, 2009

(54) NONVOLATILE SEMICONDUCTOR MEMORY DEVICE

(75) Inventors: Mikio Ogawa, Yokohama (JP); Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 11/963,000

(22) Filed: Dec. 21, 2007

(65) Prior Publication Data

US 2008/0158957 A1     Jul. 3, 2008

(30) Foreign Application Priority Data

Dec. 22, 2006   (JP)   .............................. 2006-345712

(51) Int. Cl.
  *G11C 11/00* (2006.01)
(52) U.S. Cl. .............................. 365/189.05; 365/230.03
(58) Field of Classification Search ............ 365/189.05, 365/230.03
  See application file for complete search history.

(56) References Cited

U.S. PATENT DOCUMENTS

| 6,084,799 A | 7/2000 | Tanzawa et al. |
| 7,345,913 B2 * | 3/2008 | Isobe .................... 365/185.03 |
| 7,486,562 B2 * | 2/2009 | Ogawa et al. .......... 365/185.21 |
| 2005/0195673 A1 * | 9/2005 | Asao et al. ................... 365/222 |
| 2006/0072358 A1 | 4/2006 | Kang et al. |
| 2007/0133316 A1 * | 6/2007 | Maejima et al. ........ 365/189.06 |
| 2008/0158957 A1 | 7/2008 | Ogawa et al. |

FOREIGN PATENT DOCUMENTS

JP           9-265788        10/1997

OTHER PUBLICATIONS

U.S. Appl. No. 11/836,378, filed Aug. 9, 2007, Isobe.
U.S. Appl. No. 11/873,859, filed Oct. 17, 2007, Maejima, et al.
U.S. Appl. No. 11/963,000, filed Dec. 21, 2007, Ogawa, et al.
U.S. Appl. No. 12/188,565, filed Aug. 8, 2008, Ogawa.
U.S. Appl. No. 12/188,631, filed Aug. 8, 2008, Ogawa.

* cited by examiner

*Primary Examiner*—Michael T Tran
(74) *Attorney, Agent, or Firm*—Oblon, Spivak, McClelland, Maier & Neustadt, P.C.

(57) ABSTRACT

A source line driver includes a first transistor, which has one end connected to one end of a second transistor. The first transistor has the other end connected to power supply. A third transistor has one end connected to the other end of the second transistor. The third transistor has the other end grounded. The second transistor has a control terminal connected to an output terminal of an opamp. The opamp has one input terminal supplied with a reference potential and the other input terminal connected to a node between the first transistor and the second transistor. The node is connected to a source line.

10 Claims, 5 Drawing Sheets

NONVOLATILE SEMICONDUCTOR MEMORY DEVICE

CROSS-REFERENCE TO RELATED APPLICATION

This application is based upon and claims the benefit of priority from prior Japanese Patent Application No. 2006-345712, filed on Dec. 22, 2006, the entire contents of which are incorporated herein by reference.

BACKGROUND OF THE INVENTION

1. Field of the Invention

The present invention relates to a nonvolatile semiconductor memory device, and more particularly to an electrically erasable programmable nonvolatile semiconductor memory device.

2. Description of the Related Art

A flash memory cell, or a field effect transistor has a floating gate. The flash memory cell varies the threshold voltage in accordance with the amount of charge accumulated in the floating gate. The memory cell thereby nonvolatilely stores information based on differences in threshold voltage associated with levels of information.

The invention related to such the flash memory cell is disclosed in JP 9-265788A. The threshold voltage in this flash memory cell is generally around 1-2 [V] at the initial state. The threshold voltage becomes higher when a source of the memory cell is kept at 0 [V], a drain thereof is provided with a voltage of around 12 [V], and a gate thereof is provided with a voltage of around 6-8 [V], because electrons are injected into the floating gate (programming). If the threshold voltage is made higher (for example, 6 [V]) than a voltage (for example, 5 [V]) applied to a control gate at the time of reading, no current flows in the flash memory cell having the higher threshold voltage In contrast, current can flow in the flash memory cell at the initial state. In this way, it is possible to read the stored information.

If the control gate of the flash memory cell having the higher threshold voltage is kept at 0 [V], the drain thereof is kept open, and the source thereof is provided with a voltage of about 12 [V], electrons are drawn out of the floating gate. As a result, the threshold voltage can be lowered to almost the value at the initial state (erasing operation).

In such the flash memory cell, a certain current (Id) flows in drain-source, depending on a gate-source voltage (Vgs). However, a higher drain-source resistance may be made through production processes and so forth. This may result in a memory cell that cannot allow a current (Id) more than a certain value to flow in drain-source even if a certain gate-source voltage (Vgs) is applied. Such the memory cell is a defect memory cell and not suitable for memory cell use. Specifically, if a memory cell has a smaller Gm (defined by Gm=($\partial$Id/$\partial$Vgs) than a certain value, it is a Gm-deteriorated memory cell and not suitable for memory cell use. Such the defect memory cell tends to be generated easily as the degree of memory-cell miniaturization increases.

SUMMARY OF THE INVENTION

In one aspect the present invention provides a nonvolatile semiconductor memory device, comprising: a plurality of memory cell arrays including a plurality of memory cells arrayed, the memory cell being capable of storing information in accordance with differences in threshold voltage; a selection transistors connected to one end of the memory cell, respectively; a bit line connected to the selection transistor connected to one of the ends; a source line connected to the selection transistor; and a source line driver configured to supply a source voltage at a certain level to the source line at the time of erasing, wherein the source line driver includes a first transistor, a second transistor and a third transistor connected in series, and an opamp; wherein the first transistor has one end connected to one end of the second transistor, and the first transistor has the other end connected to power supply, wherein the third transistor has one end connected to the other end of the second transistor, and the third transistor has the other end grounded, wherein the second transistor has an input terminal connected to an output terminal of the opamp, wherein the opamp has one input terminal supplied with a reference potential and the other input terminal connected to a node between the first transistor and the second transistor, wherein the node between the first transistor and the second transistor is connected to the source line.

DETAILED DESCRIPTION OF THE EMBODIMENTS

Embodiments of the Invention

An embodiment of the present invention will now be described.

Figure 1:
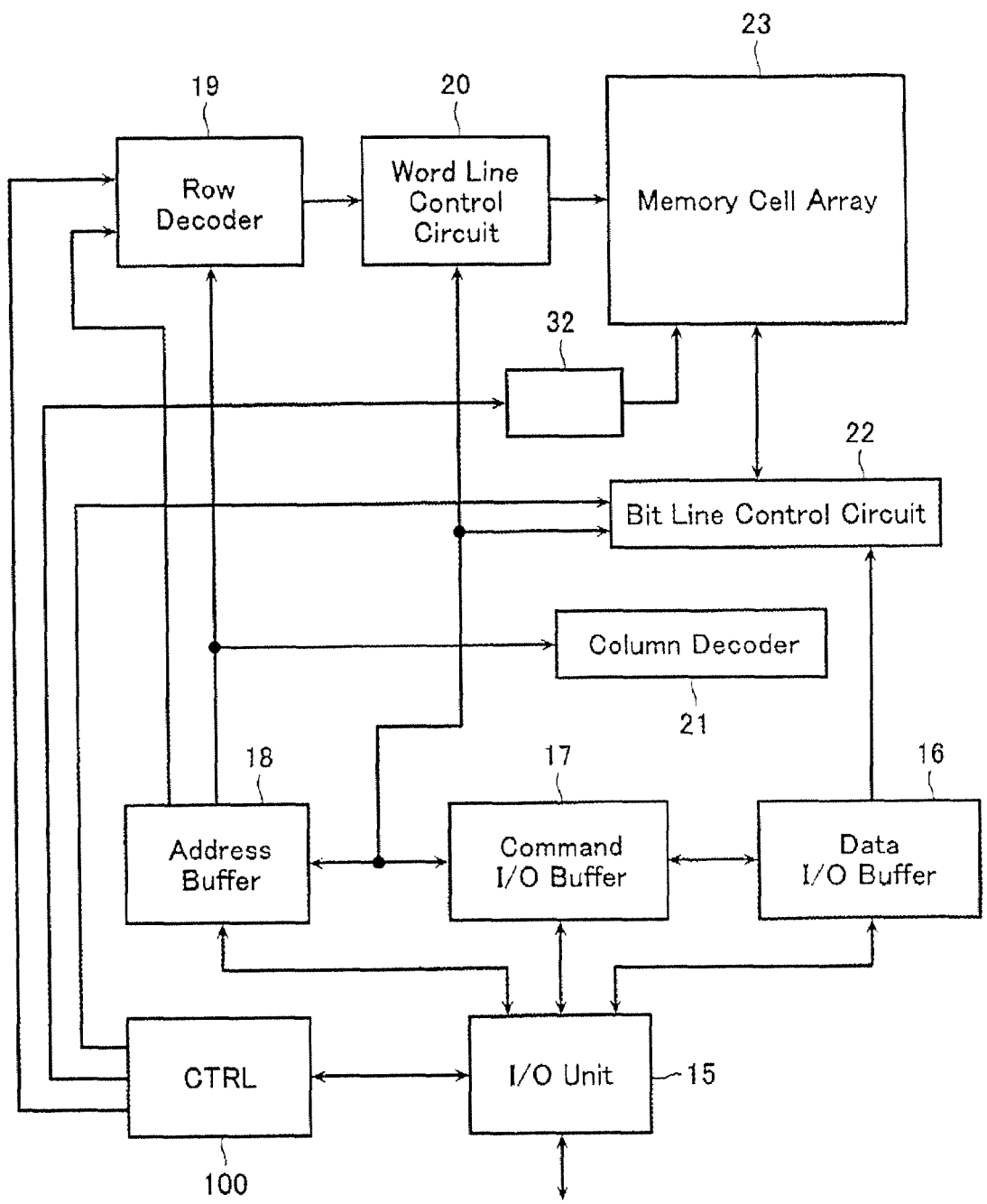
FIG. 1 is a configuration-related diagram of a nonvolatile semiconductor memory device in the present embodiment.

FIG. 1 shows a nonvolatile semiconductor memory device or NAND cell-type flash memory in the present embodiment. The nonvolatile semiconductor memory device or NAND cell-type flash memory in the present embodiment comprises an I/O unit 15, a data I/O buffer 16, a command input buffer 17, an address buffer 18, a row decoder 19, a word line control circuit 20, a column decoder 21, a bit line control circuit 22, a memory cell array 23, a CELSRC driver 32, and a controller 100.

The memory cell array 23 includes memory cells configured to store data and arrayed in a matrix. Namely, the memory cell array 23 includes a plurality of bit lines, a plurality of word lines, and a source line. Electrically erasable programmable memory cells are arrayed in a matrix on intersections of the bit lines and the word lines. The memory cells are operative to store input data, and parity data (redundant data) for error correction, which is added to the input data at every certain data bits. A word line is connected to a plurality of memory cells that configure a page. A plurality of memory cells connected to word lines, that is, a plurality of pages configure a block. The memory cell array 23 comprises a plurality of such blocks.

The memory cell array 23 is connected to the word line control circuit 20 for controlling the word line voltage, and to the bit line control circuit 22. The word line control circuit 20 selects a word line in accordance with an address signal decoded at the row decoder 19 to control the word line voltage. The row decoder 19 receives a signal via the address buffer 18 from the I/O unit 15.

The bit line control circuit 22 is a sense amp and data latch circuit having a function of sensing/amplifying a signal based on data in the memory cell in the memory cell array 23 via the bit line. In addition, it has a data latch function of holding read data or write data. The bit line control circuit 22 is connected to the column decoder 21, the data I/O buffer 16 and the command I/O buffer 17. The bit line control circuit 22 has a function of selecting a bit line in accordance with an address signal decoded at the column decoder 21.

The data I/O buffer 16 has a function of temporarily holding data input to or output from the bit line control circuit 22. Data is output from the data I/O buffer 16 via the I/O unit 15 to external and data is input to the data I/O buffer 16 via the I/O unit 15.

The command I/O buffer 17 has a function of temporarily holding a command transferred via the I/O unit 15. The address buffer 18 has a function of temporarily holding an address signal input via the I/O unit 15. A controller 100 is provided as a circuit for managing the control of the whole NAND flash memory including the row decoder 19, the bit line control circuit 22 and the later-described CELSRC driver 32.

Figure 2:
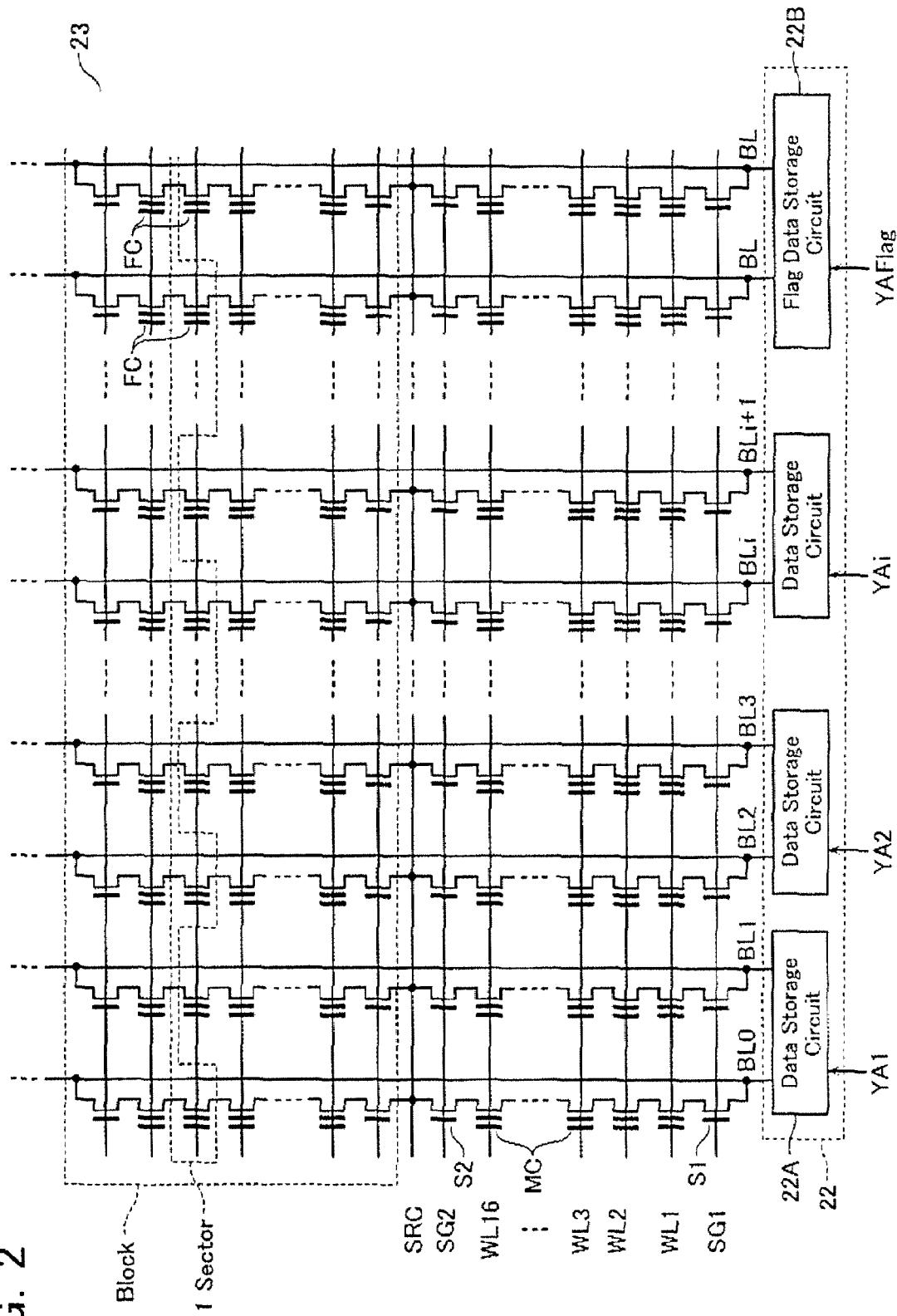
FIG. 2 is a configuration-related diagram of a memory cell array and a bit line control circuit.

The configuration of the memory cell array 23 and the CELSRC driver 32 shown in FIG. 1 is described in detail based on FIG. 2. The memory cell array 23 comprises an NAND cell-type memory cell array, which includes a plurality of NAND cells. One NAND cell includes a memory cell. MC consisting of 16 EEPROMs connected in series, for example, and selection gates S1, S2 connected to both ends thereof. The selection gate S1 is connected to the bit line BL0 while the selection gate S2 is connected to the source line SRC. The source line SRC is connected to the CELSRC driver 32 configured to drive the source line SRC.

Memory cells arranged on an identical row have respective control gates connected in common to the word line WL1, WL2, WL3, . . . or WL16. First selection gates S1 are connected in common to a selection line SG1 while second selection gates S2 are connected in common to a selection line SG2.

The memory cell array 23 includes a plurality of blocks as shown by a dashed line. Each block comprises a plurality of NAND cells, Data is erased on a block basis. Erasing is executed simultaneously with respect to two bit lines connected to a data storage circuit 22A and a flag data storage circuit 22B.

The bit line control circuit 22 includes a plurality of data storage circuits 22A and a flag data storage circuit 22B. The data storage circuits 22A and the flag data storage circuit 22B are connected to a pair of bit lines (BL0, BL1), (BL2, BL3), . . . , (BLi, BLi+1), (BL, BL), respectively. Each data storage circuit 22A has a function of holding data read out of the memory cell MC and a function of holding data to be written in the memory cell MC.

Memory cells arranged on every other one of bit lines BLi and connected to one word line WLi (memory cells within a zone surrounded by a dashed line) configure one sector. Data is written in and read out on a sector basis. Each word line WL is connected to a flag cell FC for storing flag data FLAG.

On reading, program-verifying and programming, one bit line is selected from two bit lines (BLi, BLi+1) connected to the data storage circuit 22A in accordance with an address signal (YA1, YA2, . . . , YAi, YAflag) designated from external. One word line is selected in accordance with an external address.

Figure 3:
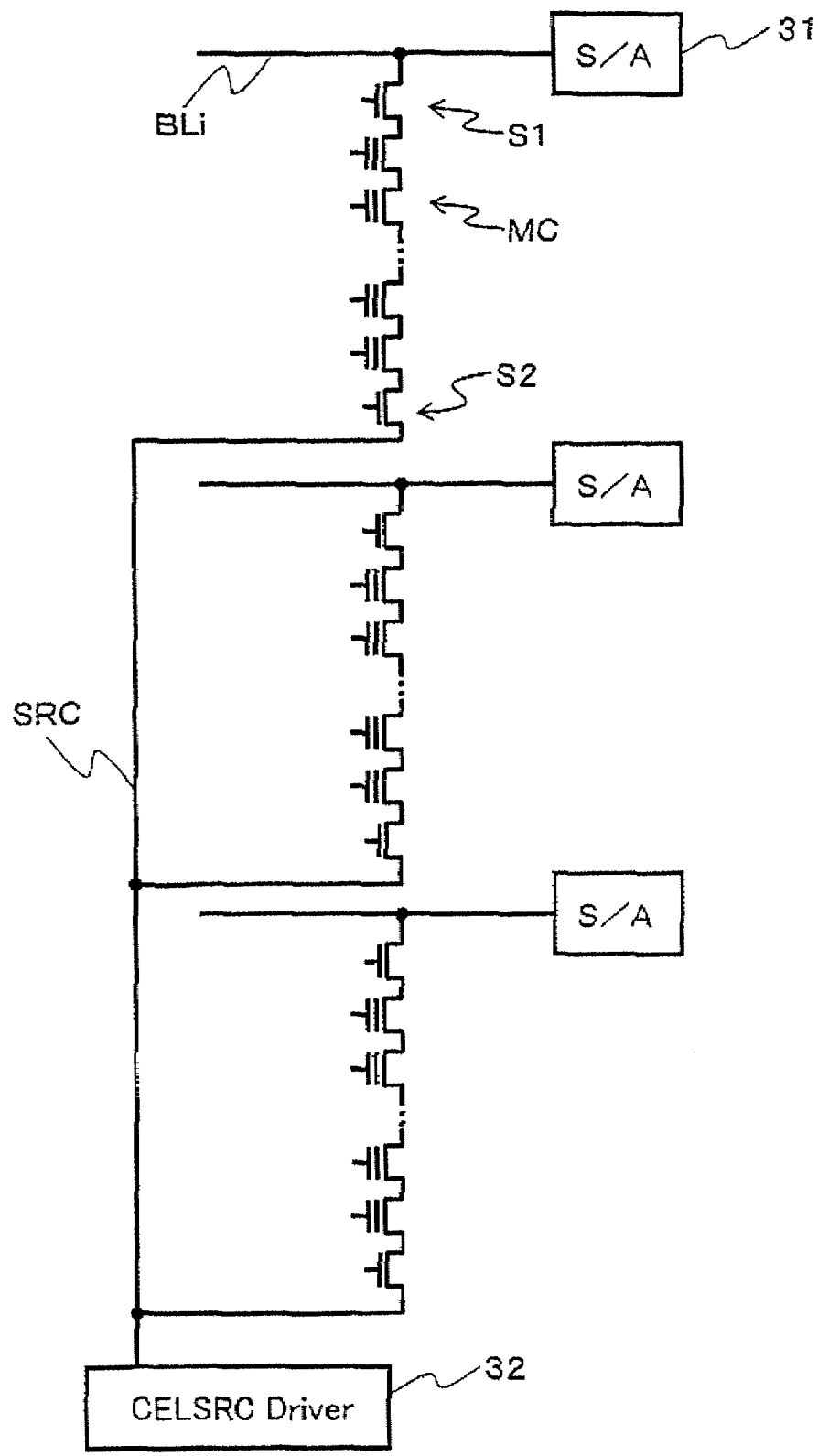
FIG. 3 is a configuration-related diagram of the memory cell array and a CELSRC driver.

The relation between the NAND-type flash memory and the CELSRC driver 32 in the present embodiment is described based on FIG. 3. The NAND-type flash memory is similar to that shown in FIG. 2 and comprises a plurality of memory cells MC connected in series, and selection gates S1, S2 connected to both ends thereof. One selection gate S1 is connected to the bit line BLi and, via the bit line BLi, to a sense amp (S/A) 31 provided in the bit line control circuit 22. The other selection gate S2 is connected to the source line SRC. The source line SRC is connected to the CELSRC driver 32.

The configuration of the CELSRC driver 32 in the present embodiment is described next based on FIG. 4. The CELSRC driver 32 in the present embodiment comprises a P-type MOS transistor T1, two N-type MOS transistors T2, T3, and an operational amplifier or opamp PA1.

The P-type MOS transistor T1 has a source connected to a supply voltage Vdd. The P-type MOS transistor T1 has a gate supplied with an input signal ENBP. The P-type MOS transistor T1 has a drain connected to a drain of the N-type MOS transistor T2. The N-type MOS transistor T2 has a gate connected to an output terminal of the opamp PA1. The N-type MOS transistor T2 has a source connected to a drain of the N-type MOS transistor T3. The gate of the N-type MOS transistor T2 is supplied with an input signal ENBN. The source of the N-type MOS transistor T2 is grounded. The opamp PA1 has one input terminal supplied with reference power supply, not shown, to apply a reference voltage potential thereto. The other input terminal is connected to a node between the drain of the P-type MOS transistor T1 and the drain of the N-type MOS transistor T2. The input signals ENBP and ENBN are provided from the above-described controller 100.

The node between the drain of the P-type MOS transistor T1 and the drain of the N-type MOS transistor T2 is connected to the output terminal of the CELSRC driver 32, and to the source line SRC.

Figure 5:
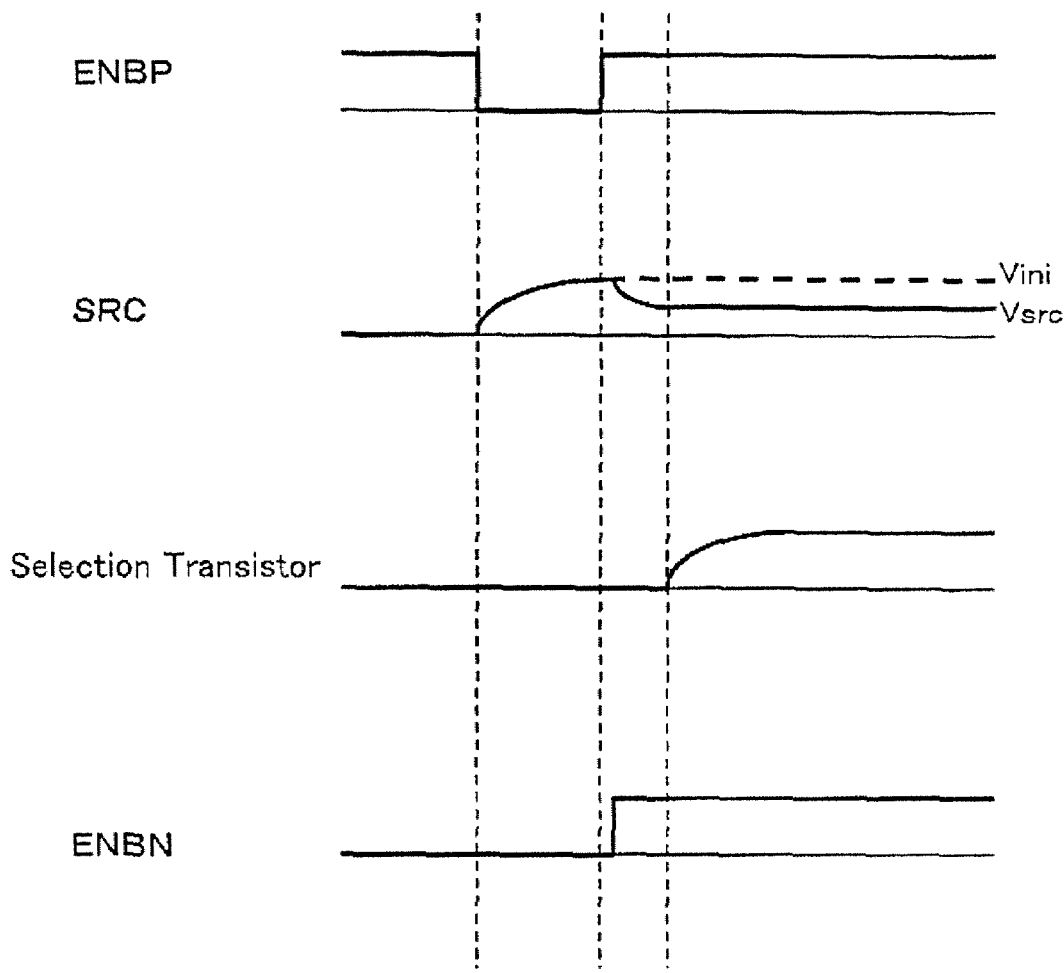
FIG. 5 is a timing chart associated with the CELSRC driver in the present embodiment.

Operation of the CELSRC driver 32 in the present embodiment to detect a defect memory cell is described next based on FIG. 5.

Figure 4:
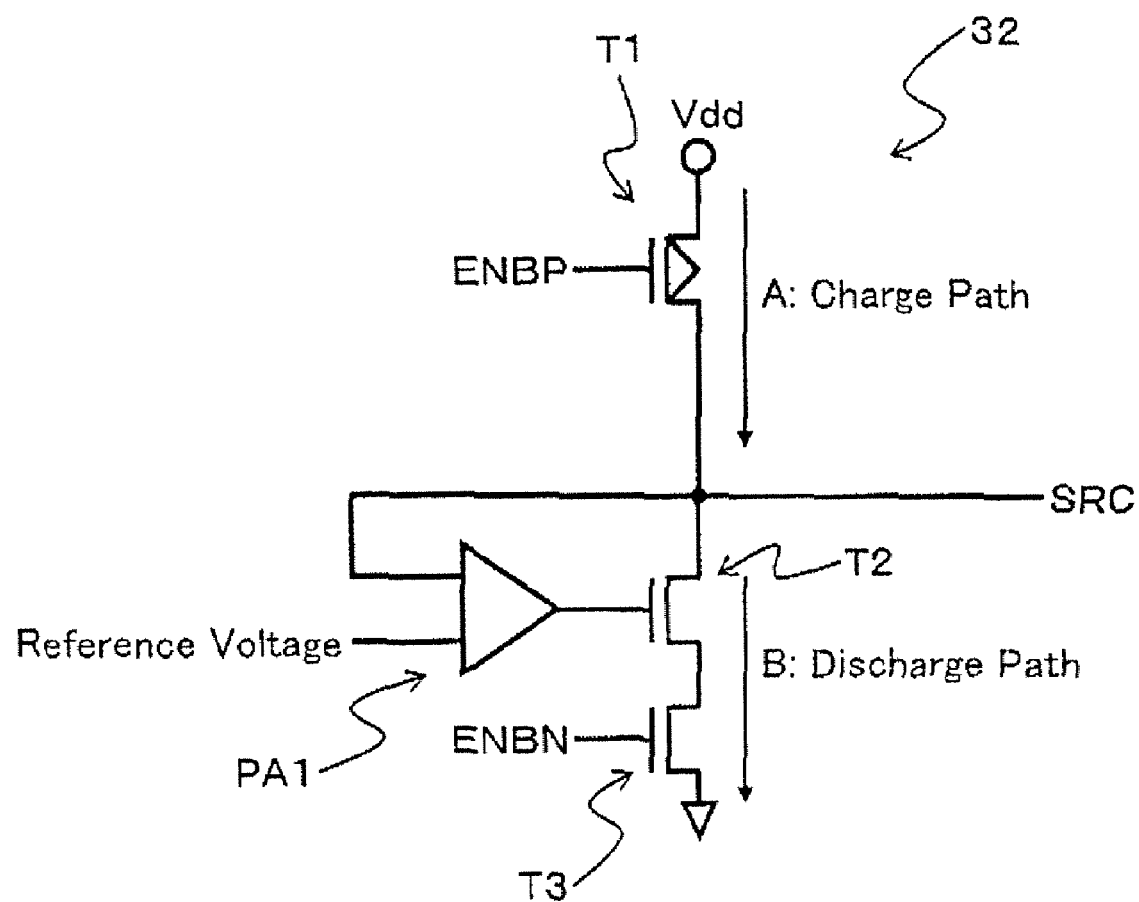
FIG. 4 is a configuration-related diagram of the CELSRC driver in the present embodiment.

First, the input signal ENBP fed to the gate of the P-type MOS transistor T1 is used to turn on the P-type MOS transistor T1 to supply charge from the supply potential Vdd to the charge path A as shown in FIG. 4. As a result, the source line SRC is charged up to a certain initial potential (Vini).

Thereafter, the P-type MOS transistor T1 is turned off to terminate charging. Then the input signal ENBN fed to the gate of the N-type MOS transistor T3 is used to turn on the N-type MOS transistor T3. As a result, as shown with the discharge path B in FIG. 4, the source line SRC is discharged such that the potential on the source line SRC reaches a certain potential (Vsrc).

Thereafter, the selection transistors S1, S2 are turned on to discharge the bit line BLi via the source line SRC. The bit line BLi is discharged while the source line SRC is kept at the certain potential (Vsrc). This state with such the source line SEC is equivalent to that the substrate potential is kept at −Vsrc. Accordingly, if the value of Vsrc is set to an appropriate potential for detecting a defect memory cell, it is made possible to detect only a Gm-deteriorated memory cell.

Figure 6:
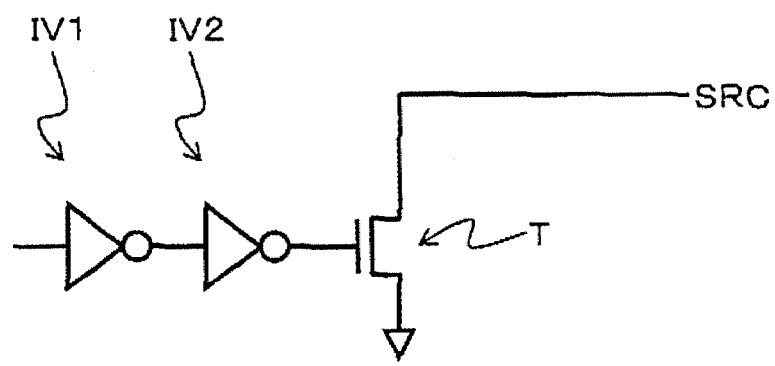
FIG. 6 is a configuration-related diagram of a conventional CELSRC driver.

In contrast, the use of a conventional CELSRC driver configured as shown in FIG. 6 may also detect a non-Gm-deteriorated memory cell as a defect memory cell and cause a lowered yield possibly. Specifically, the conventional CELSRC driver shown in FIG. 6 comprises an N-type MOS transistor T. The N-type MOS transistor T has a source grounded and a gate to receive an output signal from a serial circuit of inverters IV1, IV2. The N-type MOS transistor T has a drain connected to the source line SRC. This configuration increases or decreases the current flowing in the source line SRC in accordance with the number of bit lines BLi to be discharged and the number of memory cells. In addition, it varies the potential on the source line SRC in accordance with the wiring resistance of the source line SRC and the channel resistance in the N-type MOS transistor T. As a result, cell data in the memory cell, the wiring resistance, and the transistor characteristic may vary the substrate bias effect and make it difficult to detect only a defect memory cell.

As described above, through the use of the CELSRC driver 32 in the present embodiment, controlling the voltage on the source makes it possible to easily control the substrate potential, and easily detect only a defect memory cell.

The present invention is not limited to the above embodiments but rather can be embodied with modifications of the elements in practical stages without departing from the scope of the invention. Appropriate combinations of the elements disclosed in the above embodiments can form various inventions. For example, some elements can be deleted from all the elements shown in the embodiments. The elements in different embodiments may be combined appropriately.

What is claimed is:

1. A nonvolatile semiconductor memory device, comprising:
    a plurality of memory cell arrays including a plurality of memory cells arrayed, the memory cell being capable of storing information in accordance with differences in threshold voltage;
    a selection transistor connected to one end of said memory cell, respectively;
    a bit line connected to said selection transistor;
    a source line connected to said selection transistor; and
    a source line driver configured to supply a source voltage at a certain level to said source line at the time of erasing,
    wherein said source line driver includes a first transistor, a second transistor and a third transistor connected in series, and an opamp;
    wherein said first transistor has one end connected to one end of said second transistor, and said first transistor has the other end connected to power supply,
    wherein said third transistor has one end connected to the other end of said second transistor, and said third transistor has the other end grounded,
    wherein said second transistor has an input terminal connected to an output terminal of said opamp,
    wherein said opamp has one input terminal supplied with a reference potential and the other input terminal connected to a node between said first transistor and said second transistor,
    wherein said node between said first transistor and said second transistor is connected to said source line.

2. The nonvolatile semiconductor memory device according to claim 1, wherein said first transistor is a P-type field effect transistor, and said second transistor and said third transistor are N-type field effect transistors.

3. The nonvolatile semiconductor memory device according to claim 1, wherein said source line driver is controlled to execute charging said source line through said first transistor, then terminating charging, and discharging said source line through said third transistor.

4. The nonvolatile semiconductor memory device according to claim 1, wherein said source line driver is controlled to:
    turn on and then turn off said first transistor,
    then turn on said third transistor, and
    thereafter turn on said selection transistors, thereby detecting a defect memory cell in said memory cell array.

5. The nonvolatile semiconductor memory device according to claim 1, further comprising a control circuit for
    charging said source line through said first transistor,
    then terminating charging said source line and discharging said source line through said third transistor, and
    thereafter discharging through said selection transistors.

6. The nonvolatile semiconductor memory device according to claim 1, wherein a plurality of said memory cells are connected in series, and said selection transistors are connected to both ends of the memory cells serially connected, said memory cells and said selection transistors configuring a NAND cell unit.

7. The nonvolatile semiconductor memory device according to claim 6, wherein said first transistor is a P-type field effect transistor, and said second and third transistors are an N-type transistor.

8. The nonvolatile semiconductor memory device according to claim 6, wherein said source line driver is controlled to execute charging said source line through said first transistor, then terminating charging, and discharging said source line through said third transistor.

9. The nonvolatile semiconductor memory device according to claim 6, wherein said source line driver is controlled to:
    turn on and then turn off said first transistor,
    then turn on said third transistor, and
    thereafter turn on said selection transistors, thereby detecting a defect memory cell in said memory cell array.

10. The nonvolatile semiconductor memory device according to claim 6, further comprising a control circuit for
    charging said source line through said first transistor,
    then terminating charging said source line and discharging said source line through said third transistor, and
    thereafter discharging through said selection transistors.

* * * * *